United States Patent
Hagiwara et al.

(10) Patent No.: US 6,222,610 B1
(45) Date of Patent: *Apr. 24, 2001

(54) EXPOSURE APPARATUS

(75) Inventors: Shigeru Hagiwara, Tokyo; Masato Hamatani, Saitama-ken, both of (JP)

(73) Assignee: Nikon Corporation, Tokyo (JP)

(*) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/047,478

(22) Filed: Mar. 25, 1998

(30) Foreign Application Priority Data

Mar. 27, 1997 (JP) .................................. 9-075355

(51) Int. Cl.[7] .......................... G03B 27/52; G03B 27/42; G03B 27/32
(52) U.S. Cl. ................................. 355/30; 355/53; 355/77
(58) Field of Search ................. 355/30, 50, 53, 355/67, 77; 356/399, 400; 250/370.15

(56) References Cited

U.S. PATENT DOCUMENTS

| | | | |
|---|---|---|---|
| 4,907,021 | * 3/1990 | Yabu | 353/101 |
| 4,920,505 | * 4/1990 | Suzuki | 364/525 |
| 4,922,290 | * 5/1990 | Yoshitake et al. | 355/53 |
| 4,974,018 | * 11/1990 | Komoriya et al. | 355/53 |
| 5,337,097 | * 8/1994 | Suzuki et al. | 353/101 |
| 5,550,633 | * 8/1996 | Kamiya | 356/358 |
| 5,559,584 | * 9/1996 | Miyaji | 355/73 |
| 5,696,623 | 12/1997 | Fujie et al. | 359/350 |
| 5,871,587 | * 2/1999 | Hasegawa et al. | 118/719 |
| 5,892,572 | * 4/1999 | Nishi | 355/67 |

FOREIGN PATENT DOCUMENTS

| | | |
|---|---|---|
| 0 742 492 A1 | 11/1996 | (EP) . |
| 2 708 757 | 2/1995 | (FR) . |
| 6-216000 | 8/1994 | (JP) . |

OTHER PUBLICATIONS

Copy of European Patent Office Communication, including European Patent Office Search Report for European Patent Application No. 98302390 dated Mar. 3, 2000.

European Patent Office Communication dated Jan. 21, 2000 for European Patent Application 98302390.4 including European Search Report.

* cited by examiner

Primary Examiner—Russell Adams
Assistant Examiner—Hung Henry Nguyen
(74) Attorney, Agent, or Firm—Armstrong, Westerman, Hattori, McLeland & Naughton, LLP (57) ABSTRACT

In the exposure apparatus of the present invention, a sealed chamber defined by a first lens and a second lens in an input lens system on a plane of incidence of a fly-eye lens in an illumination optical system is provided. In a gas exchanging step, the impurity gas in the sealed chamber is first exhausted through an electromagnetic valve provided with a check valve and a gas exhaust pipe, using a gas exhaust pump and then, a high-purity nitrogen gas is supplied from a gas bomb through a gas supply pipe and an electromagnetic valve provided with a check valve to the sealed chamber. Using a pressure sensor provided in the sealed chamber, the gas exchanging step is repeated while maintaining an amount of change in pressure in the sealed chamber within a predetermined allowable range, to thereby reduce the concentration of impurities in the gas in the sealed chamber to a target value.

24 Claims, 5 Drawing Sheets

EXPOSURE APPARATUS

BACKGROUND OF THE INVENTION

1. Field of the Invention

The present invention relates to an exposure apparatus which is used for transferring a pattern on a mask to a substrate, such as a wafer, in a photolithography process for producing semiconductors, liquid crystal displays, thin-film magnetic heads, etc.

2. Description of the Related Art

As exposure apparatuses used for producing, for example, semiconductors, there can be mentioned a projection exposure apparatus, such as a stepper, in which a reticle as a mask is illuminated with exposure light passing through an illumination optical system, to thereby transfer a pattern on the reticle through a projection optical system to a photoresist-coated wafer (or a glass plate), and an exposure apparatus of a proximity type or a contact type in which the pattern on the reticle is directly transferred to the wafer, using the above-mentioned exposure light. In these exposure apparatuses, ultraviolet light, such as an i-line from a super-high pressure mercury-vapor lamp (wavelength: 365 nm), has conventionally been used as exposure light.

In conventional exposure apparatuses, a series of lenses in the illumination optical system are divided into blocks and fixedly provided in lens barrels. In the illumination optical system, chambers defined by adjacent lenses are sealed by providing sealing materials between lenses and lens barrels. These sealing materials also serve as adhesives for fixing the lenses to the lens barrels. As such sealing materials, silicon-containing materials are generally used. In other words, in the sealed chambers in the illumination optical system, silicon-containing materials which serve not only as sealing materials, but also as adhesives are used. It is known that the sealing materials (or adhesives) containing silicon generate an organosilicon gas.

In conventional exposure apparatuses in which ultraviolet light is used as exposure light, ozone is produced from oxygen molecules in an atmosphere, in the presence of ultraviolet light. When an organosilicon gas is generated from the sealing materials (or adhesives) containing silicon, the ozone produced from oxygen in the presence of ultraviolet light oxidizes the organosilicon gas and consequently, deposition of haze substance, such as silicon dioxide ($SiO_2$), on the surfaces of lenses is likely to occur. This leads to a lowering of illuminance of exposure light and a non-uniform distribution with respect to illuminance of exposure light. Because low molecular weight siloxane contained in the sealing materials (or adhesives) is a cause of the generation of organosilicon gas, in order to prevent deposition of $SiO_2$ on the surfaces of lenses in an illumination optical system, recently, materials having a low content of low molecular weight siloxane have been used as the sealing materials (or adhesives).

Thus, in illumination optical systems in conventional exposure apparatuses, sealing materials (or adhesives) which are unlikely to generate an organosilicon gas, such as materials having a low content of low molecular weight siloxane, are used. However, such sealing materials exhibit poor operability due to a prolonged solidification time. Further, even when the content of low molecular weight siloxane in the sealing material is low, liberation of silicon cannot be completely suppressed, so that an organosilicon gas is generated in a small amount with a consequence that a small amount of $SiO_2$ is likely to be deposited on the surface of lens.

As another example of sealing materials which are unlikely to generate an organosilicon gas, there can be mentioned non-evaporative two-liquid type adhesives. However, such two-liquid type adhesives also have poor operability.

Recently, there has been an increasing tendency to use, as exposure light, excimer laser beams having a short wavelength, such as a KrF excimer laserbeam (wavelength: 248 nm) and an ArF excimer laser beam (wavelength: 193 nm). On the other hand, it is known that when light having a short wavelength, such as excimer laser beams, is irradiated to adhesives containing silicon, silicon is liberated in a large amount. Therefore, it is considered that when excimer laser beams are used as exposure light, deposition of haze substance on the surfaces of lenses occurs in a wide range in the illumination optical system, so that countermeasures for deposition of haze substance have been strongly desired.

BRIEF SUMMARY OF THE INVENTION

In view of the above situation, the present invention has been made. It is a primary object of the present invention to provide an exposure apparatus in which deposition of haze substance on optical members, such as lenses, in an illumination optical system can be suppressed, to thereby prevent a lowering of light transmittance and light reflectance of the lenses.

According to the present invention, there is provided an exposure apparatus for illuminating a pattern on a mask with exposure light passing through an illumination optical system, to thereby transfer the pattern on the mask to a substrate, comprising:

a sealed chamber provided in an optical path of the exposure light in the illumination optical system, the sealed chamber containing a gas and shielded from a gas surrounding the sealed chamber in the illumination optical system; and a gas exchanging device adapted to exchange the gas in the sealed chamber with a predetermined gas.

In the above-mentioned exposure apparatus, when an inert gas is contained in the sealed chamber, generation of ozone due to ultraviolet light which is used as exposure light can be avoided, so that even when an impurity gas, such as an organosilicon gas, is generated from sealing materials which are used in optical members (such as lenses) in contact with the gas in the sealed chamber, deposition of haze substance, such as $SiO_2$, on the surfaces of optical members can be prevented. Further, when the gas in the sealed chamber is periodically exchanged with the predetermined gas, the impurity gas generated from the sealing materials can be removed. Due to the above two effects, occurrence of haze on the surfaces of optical members (leading to a lowering of light transmittance and light reflectance of the optical members) can be suppressed. As the inert gas contained in the sealed chamber, a high-purity nitrogen gas and a rare gas, such as helium, may be used.

In the above-mentioned exposure apparatus, it is preferred that the gas exchanging device comprise:

a gas exhausting system adapted to exhaust the gas in the sealed chamber;

a gas supplying system adapted to supply the predetermined gas to the sealed chamber;

a pressure sensor provided in the sealed chamber to detect a pressure in the sealed chamber; and a control system adapted to control an operation of each of the gas exhausting system and the gas supplying system, based on the pressure in the sealed chamber detected by the pressure sensor, to thereby exchange the gas in the sealed chamber with the predetermined gas.

In the exposure apparatus having the gas exchanging device arranged as mentioned above, it is possible to exchange an impurity gas in the sealed chamber with an inert gas by repeating a gas exchanging operation in which a step of exhausting the impurity gas from the sealed chamber through the gas exhausting system and a step of supplying the inert gas through the gas supplying system to the sealed chamber are successively conducted.

In the present invention, it is more preferred that when the gas in the sealed chamber is exchanged with the predetermined gas, the control system enable the gas exhausting system to exhaust the gas in the sealed chamber and the gas supplying system to supply the predetermined gas to the sealed chamber, while maintaining an amount of change in the pressure in the sealed chamber detected by the pressure sensor within a predetermined allowable range. For example, an impurity gas in the sealed chamber may be exchanged with an inert gas by exhausting the impurity gas in an extremely small amount from the sealed chamber through the gas exhausting system and subsequently, supplying the inert gas in an amount equal to the amount of exhausted impurity gas through the gas supplying system to the sealed chamber so that a radical change in pressure in the sealed chamber can be suppressed. By this arrangement, stresses acting on lenses in contact with the gas in the sealed chamber become low, so that deterioration in performance of the illumination optical system can be avoided.

When the gas in the sealed chamber is exchanged with the predetermined gas with high frequency during assembly of the exposure apparatus, while suppressing a radical change in pressure in the sealed chamber, solidification of sealing materials (or adhesives) used in the lenses in contact with the gas in the sealed chamber is promoted, so that the time required for assembling the exposure apparatus can be reduced. In this case, because the gas exchange is conducted in a substantially stationary state with respect to the pressure in the sealed chamber, stresses acting on support members for supporting the lenses in contact with the gas in the sealed chamber are low and hence, damage to the lenses and deformation of the support members can be prevented. After operation of the exposure apparatus is started, it is preferred to exchange the gas in the sealed chamber periodically during idling of the exposure apparatus.

Further, in the present invention, it is preferred that the illumination optical system in the exposure apparatus comprise a light source adapted to emit exposure light, a shaping optical system adapted to shape the exposure light passing therethrough and an optical integrator adapted to enable the exposure light to have a uniform illuminance distribution after passing through the shaping optical system, and the sealed chamber be defined by two optical members constituting the shaping optical system. Because exposure light exhibits considerably high illuminance on a plane of incidence of the optical integrator, deposition of haze substance on the surfaces of lenses in the shaping optical system is likely to occur. However, by providing a sealed chamber defined by lenses in the shaping optical system and exchanging an impurity gas in the sealed chamber with a predetermined gas, the above-mentioned deposition of haze substance on the surfaces of lenses in the shaping optical system can be avoided.

Further, according to the present invention, there is provided a method for conducting an exchange of gases in a sealed chamber provided in an exposure apparatus, comprising a gas exchanging step including:

a first sub-step of exhausting a gas in the sealed chamber from a gas exhaust side thereof, while the sealed chamber is closed on a gas supply side thereof; and a second sub-step of supplying an inert gas to the sealed chamber from the gas supply side thereof, while the sealed chamber is closed on the gas exhaust side thereof, wherein each of the first sub-step and the second sub-step is conducted in a substantially stationary state with respect to a pressure of the gas in the sealed chamber.

Still further, according to the present invention, there is provided an exposure apparatus comprising:

an illumination optical system adapted to emit exposure light, the exposure light being adapted to illuminate a mask pattern to thereby transfer the mask pattern to a substrate;

a sealed chamber provided in the illumination optical system; and a gas exchanging device adapted to exhaust a gas in the sealed chamber and supply an inert gas to the sealed chamber.

Still further, according to the present invention, there is provided a projection exposure apparatus for transferring a pattern on a mask to a photosensitive substrate, comprising:

a light source adapted to emit exposure light having a wavelength range in which a photosensitive substrate is sensitive to the exposure light;

an illumination optical system provided between the light source and the mask;

a projection optical system provided between the mask and the photosensitive substrate;

a sealed chamber containing a gas and provided in an optical path of the exposure light between the light source and the photosensitive substrate; and a gas circulating device connected to the sealed chamber, the gas circulating device being adapted to exhaust the gas contained in the sealed chamber to an outside thereof, to thereby compensate for variations in intensity of the exposure light on the photosensitive substrate.

Still further, according to the present invention, there is provided a projection exposure apparatus for transferring a pattern on a mask to a photosensitive substrate, comprising:

a light source adapted to emit exposure light having a wavelength range in which a photosensitive substrate is sensitive to the exposure light;

a sealed chamber provided in an optical path of the exposure light between the light source and the photosensitive substrate; and a gas circulating device having a sensor and connected to the sealed chamber, the sensor being adapted to detect and output information corresponding to a pressure in the sealed chamber, and the gas circulating device being adapted to supply an inert gas to the sealed chamber in accordance with the information outputted from the sensor.

Still further, according to the present invention, there is provided a method for transferring a pattern on a mask to a photosensitive substrate, comprising the steps of:

illuminating the mask with exposure light, to thereby transfer the pattern on the mask to a photosensitive substrate; and exchanging an inert gas contained in a sealed chamber with another gas, the sealed chamber being provided in an optical path of the exposure light, to thereby compensate for variations in light transmittance and light reflectance of an optical member provided in the optical path of the exposure light.

Still further, according to the present invention, there is provided an exposure apparatus for transferring a pattern on a mask to a photosensitive substrate, comprising:

an optical system adapted to allow exposure light to enter, said exposure light being adapted to be irradiated to a photosensitive substrate; and a device adapted to supply a gas capable of suppressing attenuation of said exposure light to said optical system, according to a change in light transmittance of said optical system which occurs due to entrance of said exposure light.

Still further, according to the present invention, there is provided a method for making an apparatus for transferring a pattern on a mask to a photosensitive substrate, comprising the steps of:

providing an optical system between a light source and a photosensitive substrate, said light source being adapted to emit exposure light, said exposure light being adapted to enter said optical system and irradiate said photosensitive substrate; and providing a device adapted to supply a gas capable of suppressing attenuation of said exposure light to said optical system, according to a change in light transmittance of said optical system.

The foregoing and other objects, features and advantages of the present invention will be apparent from the following detailed description and appended claims taken in connection with the accompanying drawings.

DETAILED DESCRIPTION OF THE INVENTION

Hereinbelow, an exposure apparatus according to an embodiment of the present invention is explained, with reference to the drawings.

Figure 1:
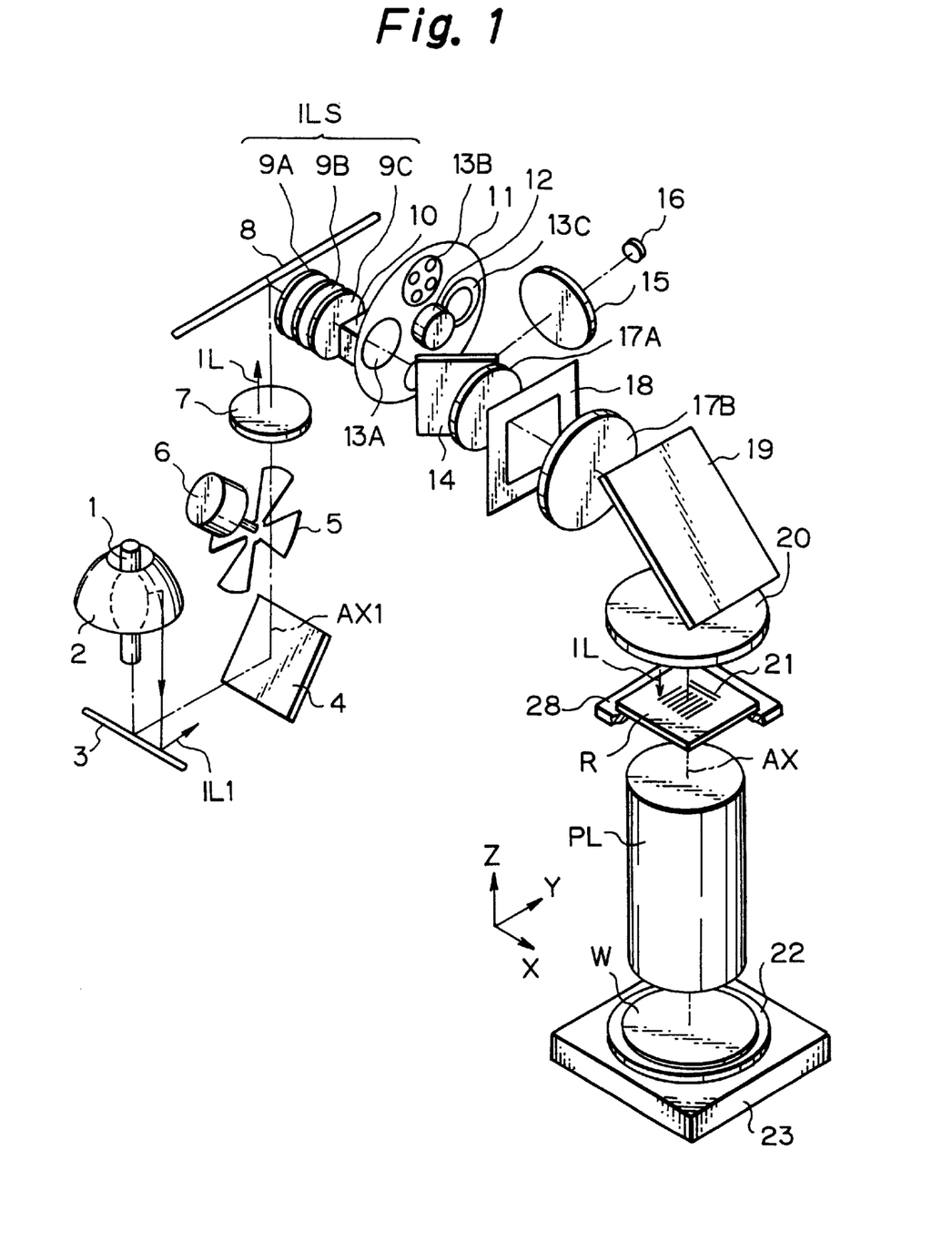
FIG. 1 is a perspective view of a partially cut-away exposure apparatus according to one embodiment of the present invention.

FIG. 1 shows a projection exposure apparatus as an exposure apparatus according to an embodiment of the present invention. In FIG. 1, illumination light IL1 from exposure light source 1 comprising a super-high pressure mercury-vapor lamp is collected by an elliptic mirror 2 and reflected by a mirror 3 and a mirror 4 toward a shutter 5. The shutter 5 is rotated by a drive motor 6, thereby opening and closing a passage for the illumination light IL1. When the shutter 5 is in an open state, the illumination light IL1 passes through the shutter 5, and illumination light exclusive of an i-line is removed by an interference filter 7. The i-line which has passed through the interference filter 7 constitutes exposure light IL and is reflected by a mirror 8 disposed so as to bend an optical path of the exposure light IL. The exposure light IL then passes through an input lens system ILS comprising a first lens 9A, a second lens 9B and a third lens 9C, and enters a fly-eye lens 10 in the form of a substantially parallel beam. Incidentally, as the exposure light IL, an h-line (wavelength: 405 nm) or a g-line (wavelength: 436 nm) may be used, instead of the i-line. An excimer laser beam, such as a KrF excimer laser beam and an ArF excimer laser beam, an $F_2$ laser beam (wavelength: 157 nm) or a harmonic component of a YAG laser beam, may also be used as the exposure light IL.

An aperture stop plate 11 for an illumination system is rotatably provided on a plane of exit of the fly-eye lens 10. The aperture stop plate 11 includes a normal circular aperture stop 13A, an aperture stop 13B for a modified light source, which comprises a plurality of small eccentric apertures, an annular stop 13C and the like. These aperture stops are formed around a rotation shaft of the aperture stop plate 11. A desired aperture stop for an illumination system can be disposed on the plane of exit of the fly-eye lens 10 by rotating the aperture stop plate 11 using a drive motor 12. A part of the exposure light IL which has passed through the desired aperture stop on the plane of exit of the fly-eye lens 10 is reflected by a beam splitter 14 and enters an integrator sensor 16 comprising a photoelectric conversion device through a collective lens 15. Illuminance of the exposure light IL on a wafer W can be indirectly monitored, based on a detection signal supplied from the integrator sensor 16.

On the other hand, the exposure light IL which has passed through the beam splitter 14 passes through a first relay lens 17A, a projection type reticle blind (variable field stop) 18, a second relay lens 17B, a mirror 19 disposed so as to bend the optical path of the exposure light IL and a condenser lens 20, and illuminates a reticle R. Thus, an illumination optical system is constituted by the exposure light source 1, the condenser lens 20 and the elements 2 to 19 provided between the exposure light source 1 and the condenser lens 20. Using the exposure light IL passing through this illumination optical system, an image of a pattern 21 on the reticle R is projected through a projection optical system PL to the photoresist-coated wafer W.

In FIG. 1, a Z-axis is taken in a direction parallel to an optical axis AX of the projection optical system PL and a coordinate system defined by an X-axis and a Y-axis which is perpendicular to the X-axis is contained in a plane perpendicular to the Z-axis. The reticle R is held on a reticle stage 28 which is adapted to perform alignment of the reticle R in an X direction, a Y direction and a rotation direction. The wafer W is held on a wafer holder 22 by suction. The wafer holder 22 is fixedly provided on a wafer stage 23. The wafer stage 23 is adapted to adjust the position of the wafer W along the Z-axis and a tilt angle of the wafer W so that the surface of the wafer W coincides with an image plane of the projection optical system PL. The wafer stage 23 is also adapted to perform stepping of the wafer W in the X direction and the Y direction and alignment of the wafer W. After exposure of one shot area on the wafer W is finished, stepping of the wafer stage 23 is conducted to thereby move another shot area on the wafer W which is subsequently subjected to exposure to an exposure field of the projection optical system PL, and exposure is conducted. Exposure is repeatedly conducted in a manner such as mentioned above by a so-called step-and-repeat exposure method, to thereby conduct exposure of a plurality of shot areas on the wafer W.

In the projection exposure apparatus in this embodiment of the present invention, ultraviolet light is used as the exposure light IL. Therefore, ozone is produced, in the presence of the exposure light IL, from oxygen within ambient air. The ozone thus produced oxidizes an organosilicon gas generated from sealing materials (or adhesives) used in optical members, such as lenses and mirrors, and deposition of haze substance, such as silicon dioxide ($SiO_2$), on the surfaces of optical members is likely to occur. In the present invention, in order to prevent such deposition of haze substance, a sealed chamber is provided in the optical path of the exposure light IL in the illumination optical system and a gas in the sealed chamber is exchanged with a predetermined gas. In the illumination optical system, the illuminance of the exposure light IL is especially high in the optical path from the exposure light source 1 to the fly-eye lens 10 as an optical integrator. In this embodiment, the sealed chamber is defined by adjacent lenses constituting the input lens system ILS which is provided on the plane of incidence of the fly-eye lens 10.

Figure 2:
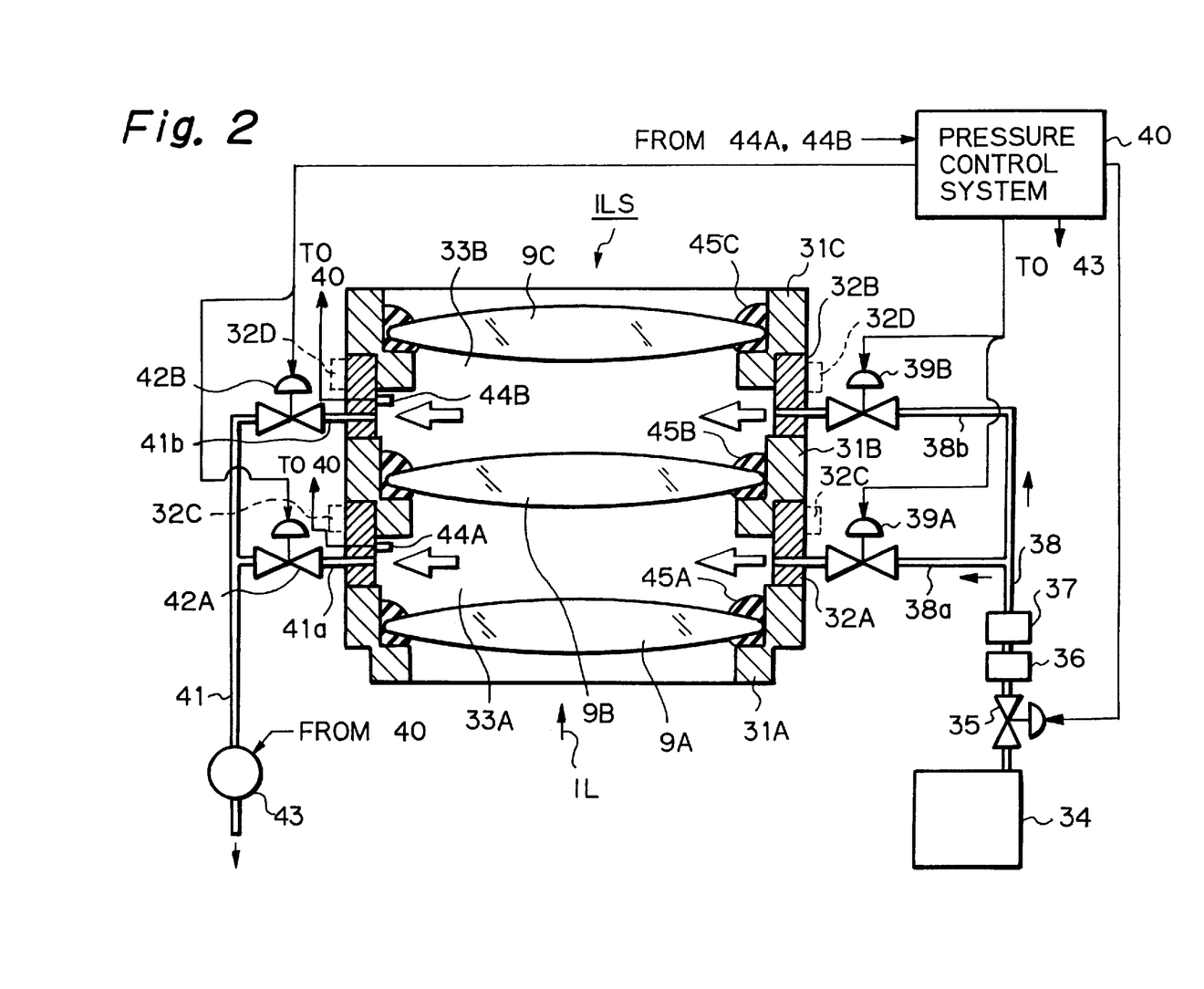
FIG. 2 is a cross-sectional view of a construction including an input lens system ILS and a gas exchange mechanism in the exposure apparatus of FIG. 1.

FIG. 2 shows a construction including the input lens system ILS and a gas exchange mechanism for the input lens system ILS. In FIG. 2, the first lens 9A, the second lens 9B and the third lens 9C are successively provided along the optical path of the exposure light IL. The first lens 9A is fixed to a ring-shaped first lens barrel 31A with a sealing material 45A being provided therebetween. A second lens barrel 31B is disposed on a ring-shaped spacer 32A above the first lens barrel 31A. The second lens 9B is fixed to the second lens barrel 31B with a sealing material 45B being provided therebetween. A third lens barrel 31C is disposed on a spacer 32B above the second lens barrel 31B. The third lens 9C is fixed to the third lens barrel 31C with a sealing material 45C being provided therebetween. Each of the sealing materials 45A to 45C contains silicon and also serves as an adhesive. In this embodiment, two sealed chambers, namely, a first sealed chamber 33A and a second sealed chamber 33B are provided in the input lens system ILS. The first sealed chamber 33A is defined by the lenses 9A and 9B, the lens barrels 31A and 31B and the spacer 32A and shielded from a gas surrounding the first sealed chamber 33A. The second sealed chamber 33B is defined by the lenses 9B and 9C, the lens barrels 31B and 31C and the spacer 32B and shielded from a gas surrounding the second sealed chamber 33B. The lens barrels 31A to 31C and the spacers 32A and 32B are firmly fixed so as not to allow the lenses 9A to 9C to be displaced due to a change in atmospheric pressure. Further, in order to maintain the temperature of a gas in each of the sealed chambers 33A and 33B at a predetermined level, pipes 32C and 32D, each of which allows a fluid having a temperature controlled to a predetermined level to pass therethrough, are disposed on respective outer surfaces of the spacers 32A and 32B.

A gas bomb 34 in which a high-purity nitrogen gas as an inert gas is sealably contained under high pressure is provided outside a chamber accommodating the projection exposure apparatus. The high-purity nitrogen gas in the gas bomb 34 is supplied through an electromagnetic valve 35, a chemical filter 36 and an HEPA filter (high efficiency particulate air-filter) 37 to a gas supply pipe 38. The opening and closing of the electromagnetic valve 35 is controlled by a pressure control system 40 comprising a computer. A first pipe 38a branched from the gas supply pipe 38 is connected to the first sealed chamber 33A through an electromagnetic valve 39A provided with a check valve. A second pipe 38b branched from the gas supply pipe 38 is connected to the second sealed chamber 33B through an electromagnetic valve 39B provided with a check valve. The opening and closing of each of the electromagnetic valves 39A and 39B is also controlled by the pressure control system 40.

Further, the first sealed chamber 33A is connected to a gas exhaust pipe 41 through a first pipe 41a for gas exhaustion and an electromagnetic valve 42A provided with a check valve. The second sealed chamber 33B is connected to the gas exhaust pipe 41 through a second pipe 41b for gas exhaustion and an electromagnetic valve 42B provided with a check valve. The gas exhaust pipe 41 opens to the atmosphere outside the chamber accommodating the projection exposure apparatus through a gas exhaust pump 43 and a filter device (not shown). The opening and closing of each of the electromagnetic valves 42A and 42B and the operation of the gas exhaust pump 43 are controlled by the pressure control system 40. Pressure sensors 44A and 44B are provided in the sealed chambers 33A and 33B, respectively, so as to detect pressures in the sealed chambers 33A and 33B. Detection signals are supplied from the pressure sensors 44A and 44B to the pressure control system 40. Thus, the pressure control system 40 monitors respective pressures of gasses in the sealed chambers 33A and 33B, based on the detection signals from the pressure sensors 44A and 44B.

Basically, the gas exchange mechanism shown in FIG. 2 is operated as follows. Initially, while the electromagnetic valves 39A and 39B on a gas supply side are closed, the pressure control system 40 opens the electromagnetic valves 42A and 42B on a gas exhaust side, and actuates the gas exhaust pump 43 so that a part of the gas in the first sealed chamber 33A, that is, remaining oxygen and an impurity gas, such as an organosilicon gas generated from the sealing materials 45A and 45B, and a part of the gas in the second sealed chamber 33B, that is, remaining oxygen and an impurity gas, such as an organosilicon gas generated from the sealing materials 45B and 45C, are exhausted. Subsequently, the pressure control system 40 closes the electromagnetic valves 42A and 42B on the gas exhaust side and opens the electromagnetic valves 39A and 39B on the gas supply side, and also opens the electromagnetic valve 35, to thereby supply the high-purity nitrogen gas from the gas bomb 34 through the gas supply pipe 38 to each of the sealed chambers 33A and 33B. The pressure control system 40 ensures that the gas exchange is conducted in a substantially stationary state so that no radical changes occur with respect to the pressures of gases in the sealed chambers 33A and 33B, which pressures are detected by the pressure sensors 44A and 44B, respectively. Thus, the respective amounts of oxygen and the impurity gas (such as an organosilicon gas generated from the sealing materials) in each of the sealed chambers 33A and 33B decrease, so that the respective concentrations of oxygen and impurities in the gas in each of the sealed chambers 33A and 33B become low and hence, a process of deposition of haze substance on each of the lenses 9A to 9C is interrupted, to thereby prevent occurrence of haze on the surfaces of these lenses.

In this embodiment, the electromagnetic valves 39A, 39B, 42A and 42B, each provided with a check valve, are employed. Therefore, the gasses in the sealed chambers 33A and 33B flow in a single direction from the gas bomb 34 toward the gas exhaust pump 43 without occurrence of a reverse gas flow. Therefore, the impurity gas in each of the sealed chambers 33A and 33B can be efficiently exchanged with the high-purity nitrogen gas.

Next, referring to FIGS. 1 to 5, explanation is made on one example of an operation for conducting an exchange of gases in the first sealed chamber 33A in a substantially stationary state using the gas exchange mechanism shown in FIG. 2. This operation is mainly conducted during idling of the projection exposure apparatus between exposure operations.

Figure 5:
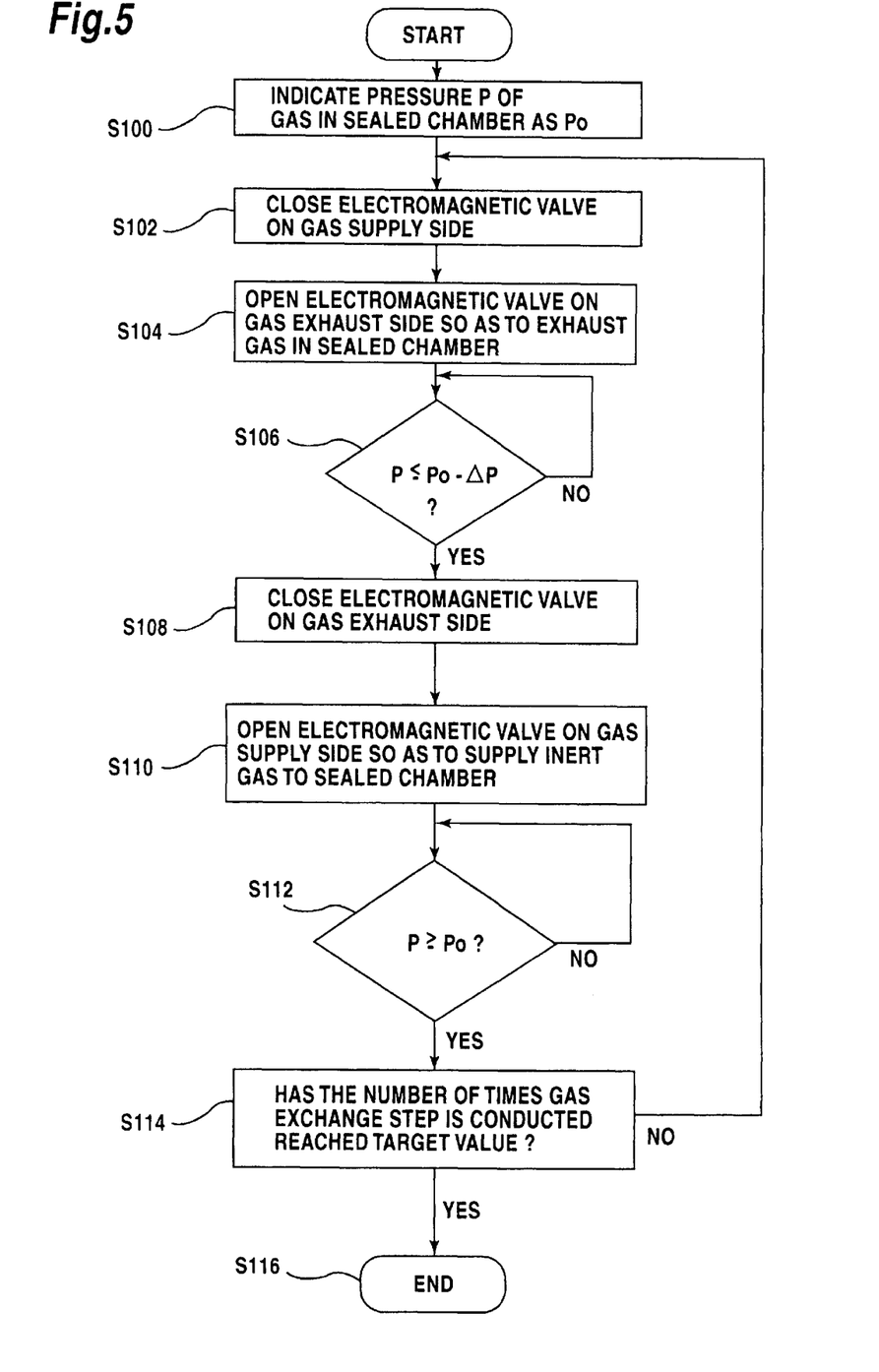
FIG. 5 is a flow chart showing the gas exchanging step of the present invention.

When the pressure P of the gas in the first sealed chamber 33A at a time point $t_0$ when an exchange of gases is started is indicated as an initial value $P_0$, this initial value $P_0$ is substantially equal to the pressure of a gas surrounding the illumination optical system (1 atm in this embodiment), as shown in step S100 in FIG. 5. At the time point $t_0$, the electromagnetic valve 42A on the gas exhaust side is opened while the electromagnetic valve 39A on the gas supply side is closed, and the gas exhaust pump 43 is actuated so as to exhaust the gas in the first sealed chamber 33A until the pressure P of the gas in the first sealed chamber 33A, which is detected by the pressure sensor 44A, decreases by an amount $\Delta p$ which is within a predetermined allowable range, as shown in steps S102, S104 and S105 in FIG. 5. The time period between the time point $t_0$ and the time point when the pressure P decreases by the allowable amount $\Delta p$ is indicated as $\Delta t_1$.

Figure 3:
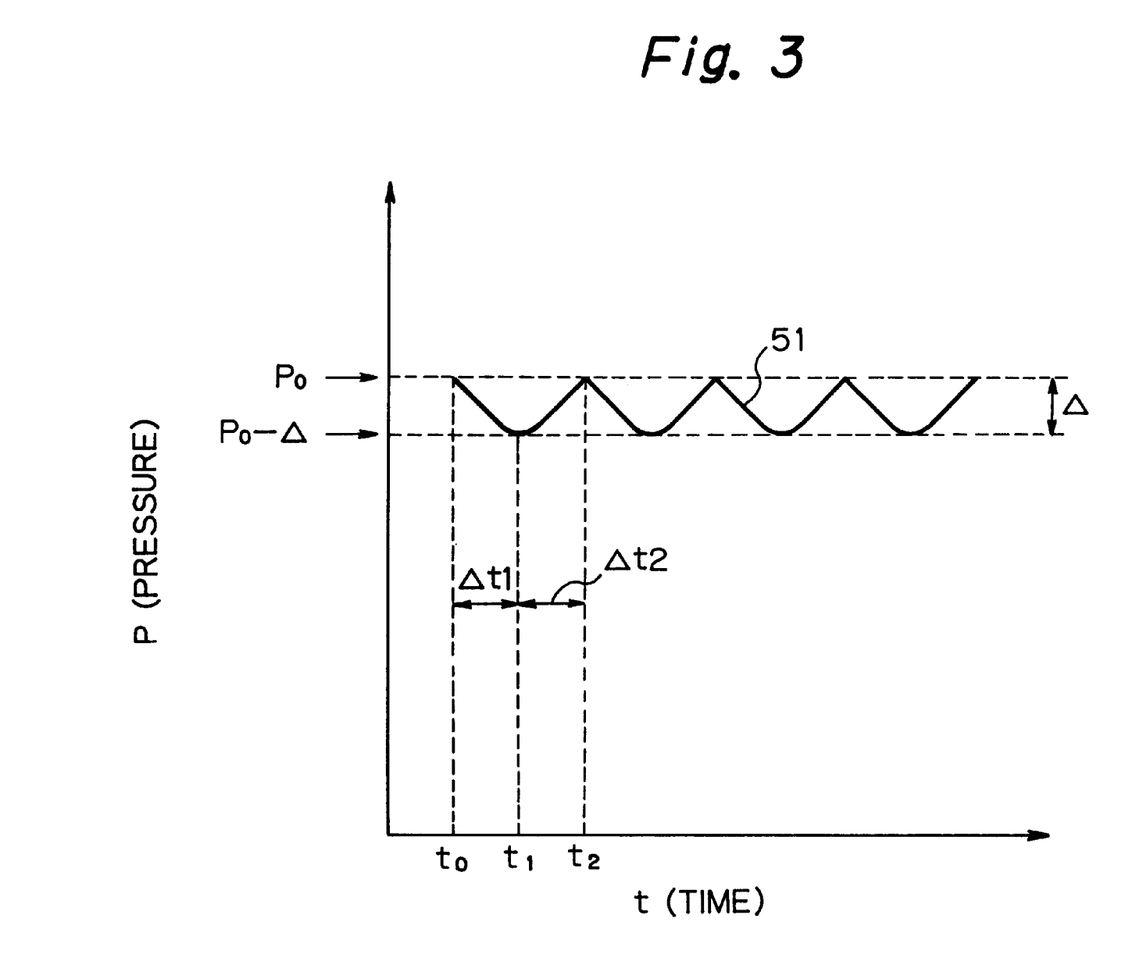
FIG. 3 is a graph showing one example of a change in pressure in the first sealed chamber 33A shown in FIG. 2 where a gas exchanging step is repeatedly conducted.

FIG. 3 is a graph showing one example of a change in pressure in the first sealed chamber 33A shown in FIG. 2 where the exchange of gases is conducted. In the graph of FIG. 3, the change in the pressure P in the first sealed chamber 33A is indicated by a solid curved line 51. In FIG. 3, the abscissa indicates the time t and the ordinate indicates the pressure P. In FIG. 3, the pressure P decreases by the allowable amount $\Delta p$ from the initial value $P_0$ at a time point $t_1$. Therefore, in FIG. 3, the above-mentioned time period $\Delta t_1$ is indicated as the time period between the time point $t_0$ and the time point $t_1$.

Subsequently, the electromagnetic valve 42A on the gas exhaust side is closed and the electromagnetic valve 39A on the gas supply side is opened, as shown in steps S108, S10 in FIG. 5. The electromagnetic valve 35 is also opened, to thereby supply the high-purity nitrogen gas from the gas bomb 34 to the first sealed chamber 33A. In this instance, using the pressure sensor 44A, the high-purity nitrogen gas is supplied until the pressure P in the first sealed chamber 33A is recovered to the initial value $P_0$. As indicated by the solid curved line 51 in FIG. 3, the pressure P is recovered to the initial value $P_0$ at a time point $t_2$, as shown in step S112 in FIG. 5. The time period between the time point $t_1$ and the time point $t_2$ is indicated as $\Delta t_2$. Thereafter, the above-mentioned operation (hereinafter, frequently referred to simply as "gas exchanging step") comprising a step of exhausting the gas in the first sealed chamber 33A until the pressure P of the gas in the first sealed chamber 33A decreases by the allowable amount $\Delta p$ from the initial value $P_0$ (first sub-step) and a step of supplying the high-purity nitrogen gas to the first sealed chamber 33A until the pressure P is recovered to the initial value $P_0$ (second sub-step) is repeated. When the gas exchanging step is repeated, the solid curved line 51 which indicates the change in the pressure P exhibits a sine waveform.

Figure 4:
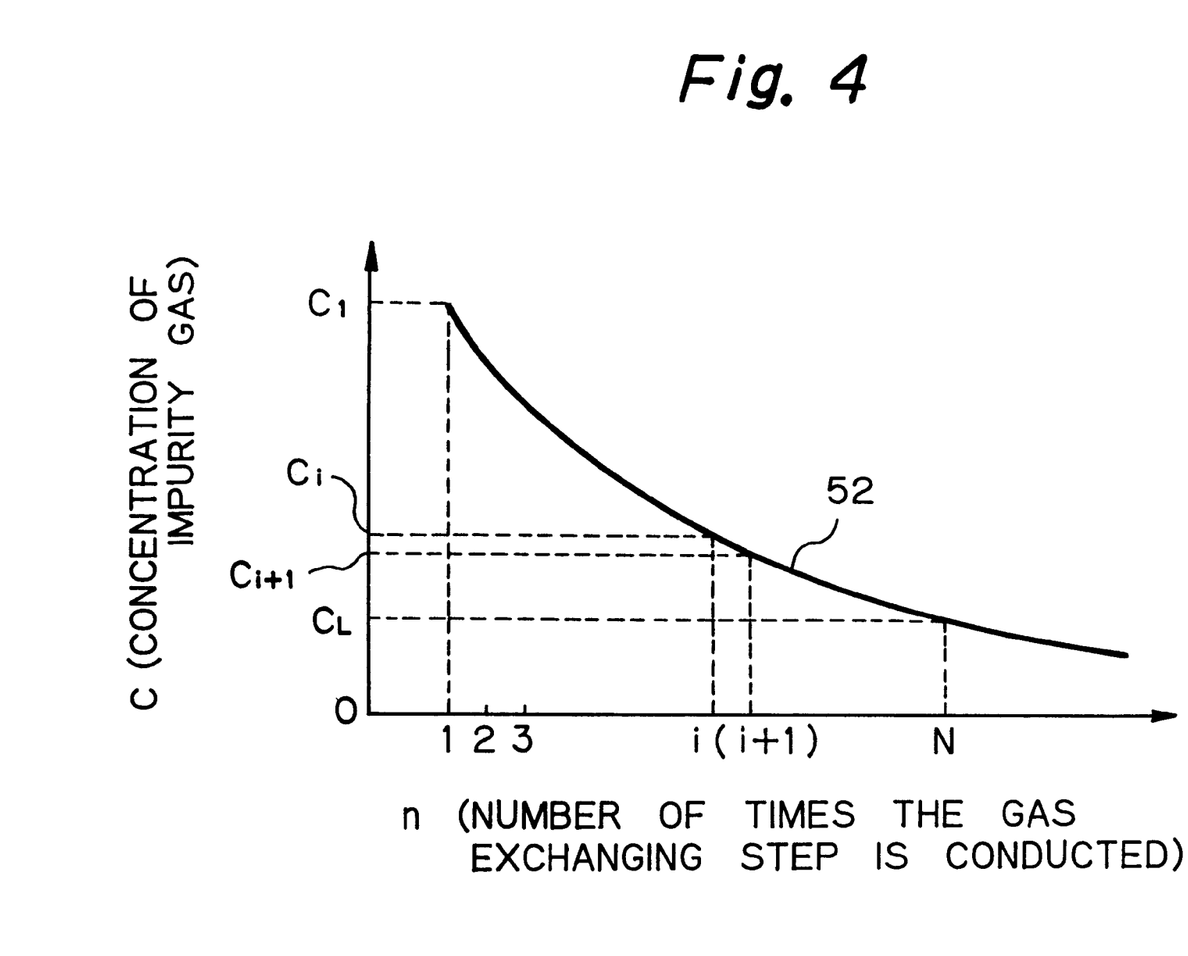
FIG. 4 is a graph showing a relationship between the number of times the gas exchanging step is conducted and the concentration of impurity gas, with respect to the first sealed chamber 33A in FIG. 2 where the gas exchanging step is repeatedly conducted.

FIG. 4 is a graph showing a relationship between the number n of times the gas exchanging step is conducted and the concentration C of impurity gas, with respect to the first sealed chamber 33A in FIG. 2 where the gas exchanging step is repeatedly conducted. The graph of FIG. 4 is obtained in a manner as mentioned below. When the amount of gas in the first sealed chamber 33A which is exchanged at each gas exchanging step (hereinafter, frequently referred to simply as "gas exchange amount") is indicated as $\Delta q$, the value of $\Delta q$ is determined in accordance with the above-mentioned allowable amount $\Delta p$. Further, when the internal volume of the first sealed chamber 33A is indicated as Q and the concentration of impurity gas (such as an organosilicon gas) in the gas in the first sealed chamber 33A after the gas exchanging step is conducted at i time(s) (i=1, 2, . . . ) is indicated as $C_i$, because gases become mixed at a sufficiently high rate, the concentration $C_{i+1}$ of impurity gas after the gas exchanging step is conducted (i+1) times is determined in accordance with the following formula (1).

$$C_{i+1}=C_i(1-\Delta q/Q) \tag{1}$$

From this formula (1), the concentration $C_i$ of impurity gas is indicated by the following formula (2), using the concentration $C_1$ of impurity gas after the gas exchanging step is conducted at one time.

$$C_i=C_1(1-\Delta q/Q)^{i-1} \tag{2}$$

When a target value of the concentration C of impurity gas is indicated as $C_L$, the following formula (3) is obtained from the formula (2), with respect to the number N of times the gas exchanging step needs to be conducted for achieving the target value $C_L$.

$$C_N=C_1(1-\Delta q/Q)^{N-1} \leq C_L \tag{3}$$

Accordingly, with respect to the number n (n=1, 2, . . . , N) of times the gas exchanging step is conducted, the concentration C of impurity gas in the gas in the first sealed chamber 33A changes as indicated by a solid curved line 52 in the graph of FIG. 4. On the other hand, the formula (3) can be reformulated as follows.

$$(1-\Delta q/Q)^{N-1} \leq C_L/C_1 \tag{4A}$$

$$(N-1) \log (1-\Delta q/Q) \leq \log (C_L/C_1) \tag{4B}$$

With respect to the formula (4B), $\log(1-\Delta q/Q)<0$ and $\log(C_L/C_1)<0$. Therefore, the formula (4B) can be reformulated as follows.

$$(N-1) \geq \log(C_L/C_1)/\log(1-\Delta q/Q) \tag{4C}$$

$$N \geq 1+\log(C_L/C_1)/\log(1-\Delta q/Q) \tag{4D}$$

Therefore, when the internal volume Q of the first sealed chamber 33A, an appropriate gas exchange amount $\Delta q$ (or the allowable amount $\Delta p$ of change in pressure of the gas in the first sealed chamber 33A), the concentration $C_1$ of impurity gas after the gas exchanging step is conducted at one time and the target value $C_L$ of the concentration C of impurity gas are determined, the minimum value $N_{min}$ of the number N of times the gas exchanging step needs to be conducted for suppressing the concentration C of impurity gas to the target value $C_L$ or less can be determined, in accordance with the formula (4D). In this embodiment, the number of times the gas exchanging step is conducted is $N_{min}$ which is the minimum value of the integer N satisfying the formula (4D). Thus, the concentration C of impurity gas can be suppressed to the target value $C_L$ or less by conducting the gas exchanging step at $N_{min}$ time(s), as shown in steps S114 and S116 in FIG. 5.

With respect to the gas exchange amount $\Delta q$ (or the allowable amount $\Delta p$ of change in pressure of the gas in the first sealed chamber 33A), when the gas exchange amount $\Delta q$ is too large, stresses acting on the lenses, such as the first lens 9A in FIG. 2, become high, so that problems arise, such as displacement, a change in aberration, damage and breakage of lenses. Even when damage or breakage of lenses is avoided, a substantial amount of stress is likely to have an adverse effect on the aberration of lenses which has already been corrected. Therefore, in this embodiment of the present invention, the gas exchange amount $\Delta q$ (or the allowable amount $\Delta p$ of change in pressure of the gas in the first sealed chamber 33A) is suppressed to a level such that the pressure in the first sealed chamber 33A changes in a substantially stationary state. For example, the allowable amount $\Delta p$ is determined as being an amount several times the amount which is capable of being detected by the pressure sensor 44A in the first sealed chamber 33A in FIG. 2, and the gas exchange amount $\Delta q$ is determined from the thus determined amount $\Delta p$. By this arrangement, an undesirable increase in stress acting on lenses during the exchange of gases in the first sealed chamber 33A can be prevented and the above-mentioned problems accompanying the exchange of gases, such as a change in aberration of lenses, can be suppressed within a sufficiently narrow allowable range.

When the minimum value $N_{min}$ of the number N of times the gas exchanging step is conducted, which is determined in accordance with the formula (4D), becomes large so that a total gas exchange time [i.e., the time period during which the gas exchanging step is conducted at $N_{min}$ time(s)] exceeds an idling time of the projection exposure apparatus, a time for conducting the gas exchanging step at one time may be reduced by reducing the time period $t_1$ and the time period $t_2$ in FIG. 3. With respect to the second sealed chamber 33B in FIG. 2, the impurity gas in the second sealed chamber 33B is exchanged with the inert gas in substantially the same manner as in the first sealed chamber 33A, while suppressing a change in aberration of lenses and the like.

Preferably, the above-mentioned gas exchanging step is conducted periodically during idling of the projection exposure apparatus, because an organosilicon gas is gradually generated from the sealing materials 45A to 45C in FIG. 2. By this arrangement, gradual deposition of haze substance on the surfaces of lenses can be prevented.

Although the gas exchanging step is conducted during idling of the projection exposure apparatus in the above-mentioned embodiment, in the present invention, the gas exchanging step may be conducted during assembly and adjustment of the projection exposure apparatus in a manner as mentioned below. That is, immediately after the lenses 9A to 9C are fixed to the lens barrels 31A to 31C with the sealing materials 45A to 45C being provided therebetween, the gas in each of the sealed chambers 33A and 33B may be exchanged with a high-purity nitrogen gas through the gas exchange mechanism in FIG. 2, while maintaining an amount of change in pressure in each of the sealed chambers 33A and 33B at $\Delta p$ or less. In this instance, because the amount of change in pressure during the gas exchanging step is as small as $\Delta p$ or less, it is unnecessary to wait until the sealing materials 45A to 45C are completely solidified. Further, because the organosilicon gas generated from the sealing materials 45A to 45C during solidification thereof is efficiently exhausted through the gas exhaust pump 43, the solidification time can be reduced and the time for assembly can also be reduced. Further, there is no phenomenon such that organosilicon substance adheres to and remains on the surfaces of the lenses 9A to 9C and the inner walls of the lens barrels 31A and 31C. Thus, deposition of haze substance on the lenses 9A to 9C can be completely prevented.

In the above-mentioned embodiment, when moisture remains in the gas supply pipe 38 in FIG. 2, such moisture enters the sealed chambers 33A and 33B, in accordance with the flow of gas supplied to the sealed chambers 33A and 33B. In this case, not only does a lowering of efficiency in exhausting impurities occur, but also the moisture react with coating materials on lenses in an early stage and the resultant reaction product is likely to be deposited on the surfaces of lenses, thereby contaminating the lenses. Therefore, it is preferred to provide the gas supply pipe 38 with another exhaust port and preliminarily clean the gas supply pipe 38 by flowing an inert gas, such as a nitrogen gas ($N_2$) and helium (He), from this exhaust port through the gas supply pipe 38.

In the above-mentioned embodiment, the gas exchange mechanism is provided in the input lens system ILS in FIG. 1. However, in the present invention, the gas exchange mechanism may also be applied to, for example, the interference filter 7, the fly-eye lens 10, the beam splitter 14, the relay lenses 17A and 17B in the illumination optical system, in order to prevent deposition of haze substance on these optical members. Further, when two fly-eye lenses 10 are provided so as to improve uniformity of illuminance distribution of exposure light and a relay lens system is provided between these two fly-eye lenses, the gas exchange mechanism may be provided in this relay lens system.

Further, as the inert gas used in the gas exchange mechanism, a high-purity nitrogen gas is employed in the above-mentioned embodiment. However, in the present invention, a chemically stable gas, for example, a rare gas, such as helium or hydrogen, may also be used as the inert gas. In an exposure apparatus in which a KrF excimer laser is used, dried air which is chemically clean may be used as the inert gas. The above-mentioned dried air is obtained by passing air through a chemical filter and adjusting the humidity of the filtered air to, for example, about 5% or less. With respect to the gas bomb 34 connected through the gas supply pipe 38 to the electromagnetic valves 39A and 39B on the gas supply side and the gas exhaust pump 43 connected through the gas exhaust pipe 41 to the electromagnetic valves 42A and 42B on the gas exhaust side in FIG. 2, the gas bomb 34 and the gas exhaust pump 43 may be temporarily connected only when the gas exchanging step is conducted in each of the sealed chambers 33A and 33B. That is, the sealed chambers 33A and 33B may be arranged so as to have a construction which is capable of being connected to the gas bomb 34 and the gas exhaust pump 43 for conducting the gas exchanging step.

Incidentally, when the pressure on the gas supply side is set to a level such that no reverse gas flow occurs, as each of the electromagnetic valves 39A, 39B, 42A and 42B, a simple electromagnetic valve may be used, instead of the electromagnetic valve provided with the check valve.

Generally, in the projection exposure apparatus, in order to correct variations in image-forming characteristics, such as the magnification and distortion of the projection optical system, which are caused by a change in atmospheric pressure, and variations in these image-forming characteristics which are caused by irradiation of exposure light (so-called irradiation-dependent variations), sealed chambers are provided in the projection optical system at several sites where the above-mentioned variations in image-forming characteristics can be effectively corrected and pressures in these sealed chambers are actively changed. Alternatively, the above-mentioned variations in image-forming characteristics are corrected directly by controlling the positions of lenses in the projection optical system (so-called lens control). Especially, when the pressures in sealed chambers are controlled, bellows are generally used.

Therefore, in the above-mentioned embodiment of the present invention, a sealed chamber having a pressure which is capable of being controlled may be provided in the projection optical system PL so that the sealed chamber contains the gas in a space between lenses which are useful for effectively conducting correction of aberration in the projection optical system PL. In this case, the pressure in the sealed chamber may be controlled utilizing a pressure of the high-purity nitrogen gas, in stead of using bellows. By this arrangement, not only can variations in image-forming characteristics be corrected, but also deposition of haze substance on the surfaces of lenses in contact with the gas in the sealed chamber in the projection optical system PL can be prevented.

When the sealed chamber is provided in an optical path between the reticle and the wafer, the pressure of the inert gas contained in the sealed chamber may not be controlled, and as disclosed in, for example, U.S. Pat. No. 5,117,255, optical characteristics (such as a focus position, a magnification, aberrations and telecentricity) and image-forming characteristics (such as image contrast) with respect to an image of the pattern on the reticle may be adjusted by moving at least one optical member in the projection optical system PL. In this case, an inert gas is selectively supplied to the sealed chamber so as to compensate for variations in light transmittance of the illumination optical system and/or the projection optical system PL, i.e., variations in light intensity of exposure light on the wafer. With respect to the optical integrator provided in the illumination optical system, the optical integrator is not limited to the fly-eye lens. A rod integrator may also be used as the optical integrator. The fly-eye lens and the rod integrator may be used in combination, as disclosed in U.S. Pat. No. 4,918, 583.

The present invention can be applied to not only a one-shot exposure type projection exposure apparatus, but also a scanning exposure type projection exposure apparatus, such as a step-and-scan type. The present invention can also be applied to an exposure apparatus of a proximity type or a contact type in which the projection optical system is not used. Thus, the present invention is not limited to the above-mentioned embodiment. Various modifications are possible without departing from the scope of the present invention as defined in the appended claims.

In the exposure apparatus of the present invention, a sealed chamber is provided in an optical path of exposure light in the illumination optical system. The gas in the sealed chamber is exchangeable. Therefore, for example, when the gas in the sealed chamber which is likely to generate haze substance is periodically exchanged with another gas, deposition of substance which lowers light transmittance and light reflectance of optical members, such as lenses, in the illumination optical system is unlikely to occur. Therefore, a lowering of illuminance of exposure light on the mask and a non-uniform distribution with respect to illuminance of exposure light can be suppressed.

Further, in the exposure apparatus of the present invention in which a pressure sensor is provided in the sealed chamber, the pressure in the sealed chamber can be maintained at a desired level.

In this instance, it is preferred that when the gas is in the sealed chamber is exchanged with a predetermined gas, the gas in the sealed chamber be exhausted through the gas exhausting system and the predetermined gas be supplied to the sealed chamber through the gas supplying system, while maintaining an amount of change in the pressure in the sealed chamber detected by the pressure sensor within a predetermined allowable range, from the viewpoint of suppressing a radical change in pressure in the sealed chamber.

When a radical change in pressure in the sealed chamber is suppressed, stresses acting on optical members (such as lenses) in contact with the gas in the sealed chamber become low, so that an adverse effect on aberration of the optical members can be avoided.

Further, the present invention is especially advantageous when the illumination optical system comprises a light source adapted to emit exposure light, a shaping optical system adapted to shape the exposure light passing therethrough and an optical integrator adapted to enable the exposure light to have a uniform illuminance distribution after passing through the shaping optical system, and the sealed chamber is defined by two optical members constituting the shaping optical system, because it is possible to exchange the gas in a region where the illuminance of exposure light is high and therefore deposition of haze substance is likely to occur, and prevent occurrence of haze in that region.

The entire disclosure of Japanese Patent Application No. Hei 9-75355 filed on Mar. 27, 1997 is incorporated herein by reference in its entirety.

What is claimed is:

1. A method for conducting an exchange of gases in a space provided in an exposure apparatus for transferring a pattern formed on a mask onto a substrate by exposure light, comprising:

said space being provided in an optical path of the exposure light;

closing a gas supply side of said space;

exhausting a gas in said space from a gas exhaust side thereof until a pressure in said space becomes a first value, the gas including an impurity causing occurrence of cloud on the surface of an optical element in contact with said space;

closing the gas exhaust side of said space and opening the gas supply side of said space; and supplying a predetermined gas after passing through an impurity removing filter to said space from the gas supply side thereof until the pressure in said space becomes a second value.

2. The method according to claim 1, wherein said exchange of the gas including the impurity in said space for the predetermined gas after passing through the impurity removing filter is conducted during idling of said exposure apparatus.

3. The method according to claim 2, wherein said method further comprises reducing a time for said exchange of the gas including the impurity in said space for the predetermined gas after passing through the impurity removing filter when the time for said exchange of the gases exceeds a time for said idling.

4. The method according to claim 1, wherein said exchange of the gas including the impurity in said space for said predetermined gas after passing through the impurity removing filter is conducted during assembly and adjustment of said exposure apparatus.

5. The method according to claim 1, wherein said exhausting of the gas including the impurity in said space is conducted to exhaust a part of the gas in said space and said exhausting of the part of the gas in said space and said supplying of the predetermined gas are alternately conducted at a plurality of times.

6. The method according to claim 5, further comprising:

counting the number of times said exhausting of the part of the gas in said space and said supplying of the predetermined gas after passing through the impurity removing filter are alternately conducted; and measuring a time for said exchange of gases in said space based on the counted number of times.

7. The method according to claim 1, wherein said exposure apparatus has a light source adapted to emit the exposure light and wherein said space is provided between said light source and said substrate.

8. The method according to claim 7, wherein said space is provided between optical members located between said light source and said substrate.

9. The method according to claim 8, wherein said optical members are a part of an illumination optical system adapted to illuminate the mask having the pattern formed thereon with the illumination light from the light source.

10. The method according to claim 9, wherein the impurity exhausted from said space is generated from a support member adapted to support said optical members.

11. The method according to claim 10, wherein said predetermined gas is an inert gas.

12. The method according to claim 1, wherein said first value is set at a value within a predetermined allowable range of an amount of change in pressure in said space.

13. The method according to claim 1, wherein said second value is set at a pressure value in said space before said exhausting of the gas from said space.

14. The method according to claim 1, wherein said space is provided between optical members which are included in an illumination optical system adapted to illuminate a mask having a pattern formed thereon, and wherein said second value is equal to a pressure of a gas surrounding said illumination optical system.

15. A method for conducting an exchange of gases in a space provided in an exposure apparatus for transferring a pattern formed on a mask onto a substrate by exposure light, comprising:

said space being provided in an optical path of the exposure light;

exhausting at least part of a gas in said space through an exhausting system connected to said space, the gas including an impurity causing occurrence of cloud on the surface of an optical element in contact with said space; and supplying a predetermined gas after passing through an impurity removing filter to said space through a supplying system connected to said space, wherein said exhausting of the at least part of the gas in said space and said supplying of the predetermined gas are alternately conducted at a plurality of times.

16. The method according to claim 15, wherein while said exhausting of the gas including the impurity in said space and said supplying of the predetermined gas after passing through the impurity removing filter are alternately conducted, said exhausting system and said supplying system are controlled so that an amount of change in pressure in said space is within a predetermined range.

17. The method according to claim 16, further comprising:

determining a target value of a concentration of the impurity in said space; and determining, based on said target value, the number of times said exhausting of the gas in said space and said supplying of the predetermined gas are conducted.

18. The method according to claim 17, wherein said number of times is determined, in consideration of a volume of said space, an allowable amount of change in pressure in said space and a concentration of the impurity in said space after the first time of conducting said exhausting of the gas in said space and said supplying of the predetermined gas.

19. The method according to claim 15, wherein said exposure apparatus has a light source adapted to emit the exposure light and wherein said space is provided between said light source and said substrate.

20. A method according to claim 15, wherein said exposure apparatus is adapted to illuminate a mask with illumination light from a light source to transfer a pattern formed on the mask onto a substrate, wherein said space is defined between optical members provided between said light source and said substrate, and wherein the impurity is substance generated from an adhesive member used for fixing the optical members to a lens barrel.

21. The method according to claim 20, wherein said space is provided in an illumination optical system adapted to illuminate the mask with the illumination light from the light source.

22. The method according to claim 21, wherein said gas including the impurity is an organosilicon gas.

23. A method for exchanging a gas in a space provided in an exposure apparatus comprising:

monitoring change in pressure in said space;

controlling exhausting of at least part of a gas in said space, the gas including an impurity causing occurrence of cloud on the surface of an optical element in contact with said space and supplying of a predetermined gas after passing through an impurity removing filter to said space so that the change in pressure in said space is within a predetermined range.

24. The method according to claim 23, wherein the change in pressure in said space is monitored by a pressure sensor provided in said space.

* * * * *